United States Patent
Jain et al.

(10) Patent No.: US 9,590,082 B1
(45) Date of Patent: Mar. 7, 2017

(54) INTEGRATION OF HETEROJUNCTION BIPOLAR TRANSISTORS WITH DIFFERENT BASE PROFILES

(71) Applicant: GLOBALFOUNDRIES Inc., Grand Cayman (KY)

(72) Inventors: Vibhor Jain, Essex Junction, VT (US); Qizhi Liu, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/965,267

(22) Filed: Dec. 10, 2015

(51) Int. Cl.
  *H01L 29/08* (2006.01)
  *H01L 29/737* (2006.01)
  *H01L 29/165* (2006.01)
  *H01L 29/66* (2006.01)
  *H01L 29/06* (2006.01)
  *H01L 29/10* (2006.01)

(52) U.S. Cl.
  CPC ........ *H01L 29/737* (2013.01); *H01L 29/0649* (2013.01); *H01L 29/1008* (2013.01); *H01L 29/165* (2013.01); *H01L 29/66242* (2013.01)

(58) Field of Classification Search
  CPC ........... H01L 29/66242; H01L 29/7371; H01L 29/7378; H01L 29/0821
  USPC .......... 257/194, E29.246–E29.253, E21.403, 257/E21.407, 197, E29.033, E29.189, 257/E21.387, E21.696, 183, 565, 257/E21.371, E21.608, E27.055; 438/167, 172
  See application file for complete search history.

(56) References Cited

U.S. PATENT DOCUMENTS

| | | | |
|---|---|---|---|
| 7,679,164 B2 * | 3/2010 | Pagette | H01L 29/0821 257/526 |
| 7,855,404 B2 | 12/2010 | Heinenmann et al. | |
| 8,035,167 B2 | 10/2011 | Knoll et al. | |
| 8,692,288 B2 * | 4/2014 | Dunn | H01L 29/7378 257/140 |
| 2002/0070410 A1 * | 6/2002 | Freeman | H01L 21/8222 257/370 |

\* cited by examiner

*Primary Examiner* — David Vu
*Assistant Examiner* — Jonathan Han
(74) *Attorney, Agent, or Firm* — Thompson Hine LLP; Anthony Canale (57) ABSTRACT

Device structures and fabrication methods for a heterojunction bipolar transistor. A first base layer is formed on a first device region of a substrate. A first emitter is formed that defines a first junction with the first base layer. A second base layer is formed on a second device region of a substrate. A second emitter is formed that defines a second junction with the second base layer. The first base layer and the second base layer differ in thickness, composition, concentration of an electrically-active dopant, or a combination thereof.

15 Claims, 6 Drawing Sheets

INTEGRATION OF HETEROJUNCTION BIPOLAR TRANSISTORS WITH DIFFERENT BASE PROFILES

BACKGROUND

The invention relates generally to semiconductor devices and integrated circuit fabrication and, in particular, to fabrication methods and device structures for bipolar junction transistors and heterojunction bipolar transistors.

Bipolar junction transistors may be found, among other end uses, in radiofrequency transceivers, multi-gigabit analog-to-digital converters, optical networks, automotive radar, and high-speed circuits. Bipolar junction transistors may be combined with complementary metal-oxide-semiconductor (CMOS) field effect transistors in bipolar complementary metal-oxide-semiconductor (BiCMOS) integrated circuits, which take advantage of the favorable characteristics of both transistor types.

Bipolar junction transistors are three-terminal electronic devices that include an emitter, an intrinsic base, and a collector arranged such that the intrinsic base is situated between the emitter and collector. An NPN bipolar junction transistor may include n-type semiconductor material regions constituting the emitter and collector, and a region of p-type semiconductor material constituting the intrinsic base. A PNP bipolar junction transistor includes p-type semiconductor material regions constituting the emitter and collector, and a region of n-type semiconductor material constituting the intrinsic base. In operation, the base-emitter junction is forward biased and the base-collector junction is reverse biased. The collector-emitter current may be controlled by the base-emitter voltage.

A heterojunction bipolar transistor (HBT) is a type of bipolar junction transistor in which two or more of the emitter, intrinsic base, and/or collector are composed of semiconductor materials with unequal band gaps, which creates heterojunctions. For example, the collector and/or emitter of a heterojunction bipolar transistor may be composed of silicon, and the base of a heterojunction bipolar transistor may be composed of silicon germanium (SiGe), which is characterized by a narrower band gap than silicon. In a wireless design, the interfaces between the antenna and the electronic circuits are provided by a low-noise amplifier (LNA) and a power amplifier (PA), each of which may include a heterojunction bipolar transistor with a SiGe base.

Improved fabrication methods and device structures are needed for bipolar junction transistors and heterojunction bipolar transistors.

SUMMARY

In an embodiment of the invention, methods are provided for fabricating a device structure. A first base layer is formed on a first device region of a substrate. A first emitter is formed that defines a first junction with the first base layer. A second base layer is formed on a second device region of a substrate. A second emitter is formed that defines a second junction with the second base layer. The first base layer and the second base layer differ in thickness, composition, concentration of an electrically-active dopant, or a combination thereof.

In an embodiment of the invention, a device structure includes a first base layer on a first device region of a substrate, a first emitter on the first base layer, a second base layer on a second device region of the substrate, and a second emitter on the second base layer. The first emitter defines a first junction with the first base layer, and the second emitter defines a second junction with the second base layer. The first base layer and the second base layer differ in thickness, composition, concentration of an electrically-active dopant, or a combination thereof.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1A:
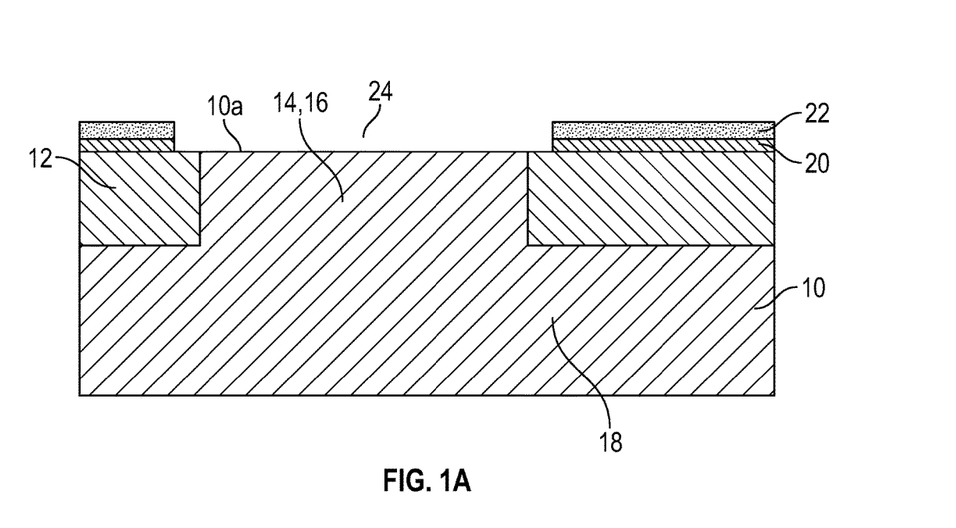
FIG. 1A is a cross-sectional view of a portion of a substrate at an initial fabrication stage of a processing method for fabricating device structures in accordance with an embodiment of the invention.
Figure 1B:
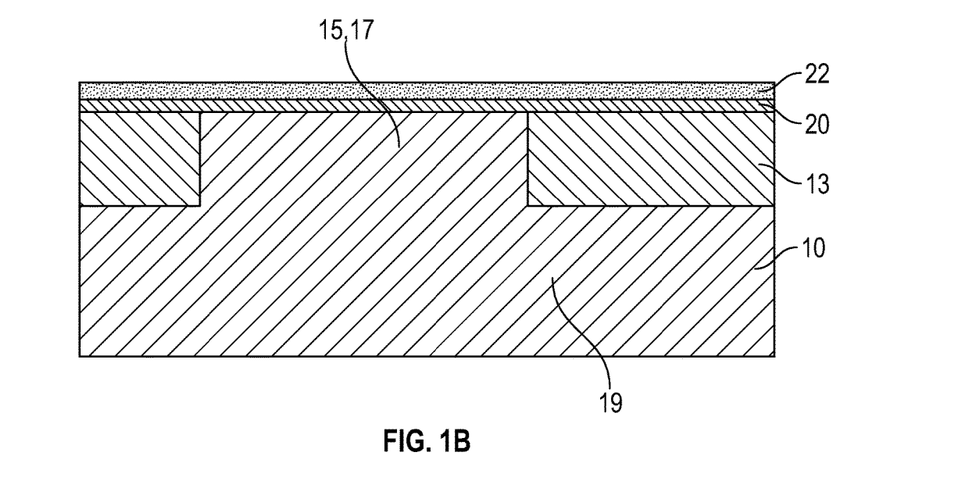
FIG. 1B is a cross-sectional view similar to FIG. 1A of a different substrate portion at the initial fabrication stage of the processing method.

With reference to FIGS. 1A, 1B and in accordance with an embodiment of the invention, a substrate 10 comprises a single-crystal semiconductor material usable to form the devices of an integrated circuit. The semiconductor material constituting the substrate 10 may include an epitaxial layer at its top surface 10a, which may contain an amount of an electrically-active dopant that enhances its electrical properties relative to the remainder of the substrate 10. For example, the substrate 10 may include an epitaxial layer of single crystal silicon that is doped with a concentration of, in a construction for an NPN transistor, an n-type dopant (e.g., phosphorus (P) or arsenic (As)) from Group V of the Periodic Table in a concentration effective to impart n-type conductivity.

Trench isolation regions 12, 13 are located in the semiconductor material of the substrate 10. The trench isolation regions 12, 13 extend from the top surface 10a of the substrate 10 to a shallow depth beneath the top surface 10a. A device region 14 used in fabricating a device structure is located between the trench isolation regions 12. A device region 15 used in fabricating a device structure is located between the trench isolation regions 13. The device regions 14, 15, which are comprised of different portions of the semiconductor material of the substrate 10, each have a width and a length that are determined by the arrangement of the respective trench isolation regions 12, 13. The device regions 14, 15 also have a vertical dimension or height in a direction normal to a plane containing its length and width that is established by the respective penetration depths of the trench isolation regions 12, 13 into the substrate 10 relative to its top surface 10a.

The trench isolation regions 12, 13 may be formed by depositing a hardmask, patterning the hardmask and substrate 10 with lithography and etching processes to define trenches penetrating into the substrate 10, depositing an electrical insulator to fill the trenches, planarizing the electrical insulator relative to the hardmask using a chemical mechanical polishing (CMP) process, and removing the hardmask. In one embodiment, the trench isolation regions 12, 13 may be comprised of silicon dioxide ($SiO_2$) deposited by chemical vapor phase deposition (CVD).

A collector 16 may be comprised of a section or all of the material of the device region 14 located between the trench isolation regions 12. A collector 17 may be comprised of a section or all of the material of the device region 15 located between the trench isolation regions 13. The collectors 16, 17 may contain a concentration of an electrically-active dopant, such as an n-type dopant in a concentration that is effective to impart n-type conductivity to the semiconductor material. In an embodiment, the collectors 16, 17 may include a different concentration of the n-type dopant that can be produced, for example, by use of selective ion implantation. A subcollector 18 comprised of semiconductor material with the same conductivity type as the collector 16 may extend laterally in the substrate 10 beneath the trench isolation regions 12 order to couple the collector 16 of the device region 14 with a collector contact region. Similarly, a subcollector 19 comprised of semiconductor material with the same conductivity type as the collector 16 may extend laterally in the substrate 10 beneath the trench isolation regions 13 order to couple the collector 17 of the device region 15 with a collector contact region.

A pad layer 20 and a layer 22 are deposited in a layer stack across the top surface 10a of the substrate 10. The pad layer 20 may be comprised of a dielectric material, such as silicon dioxide deposited by chemical vapor deposition. The layer 22 may be comprised of a polycrystalline semiconductor material, such as polycrystalline silicon (i.e., polysilicon), deposited by chemical vapor deposition.

Layer 22 is opened by patterning to introduce an opening 24 that extends through its full thickness to the device region 14 at the top surface 10a of the substrate 10. The opening 24 may be larger in width than the device region 14 so that the opening 24 overlaps slightly with the trench isolation regions 12 at its periphery. The opening 24 may be formed by applying a mask to the top surface 10a of the substrate 10. The mask may comprise, for example, a photoresist that is applied with a spin coating process, pre-baked, exposed to a radiation projected through a photomask, baked after exposure, and developed with a chemical developer to define a pattern with an opening at the intended location of the opening 24. An etching process may be used to remove the unmasked material of the layer 22 to define the opening 24. The etching process may comprise a wet chemical etch or a dry etch, and may rely on a given etch chemistry that removes the dielectric material of the layer 22 selective to (i.e., at a higher rate than) the dielectric material of the pad layer 20. The pad layer 20 may then be removed from inside the opening 24 by an etching process, such as by an etching process using dilute hydrofluoric (DHF) or buffered hydrofluoric (BHF). The layer 22 is masked by the mask and is preserved over the device region 15 and in its vicinity during patterning.

The mask may be removed subsequent to the formation of the opening 24. If comprised of a photoresist, the mask may be removed by ashing or solvent stripping, followed by a cleaning process.

Figure 2A:
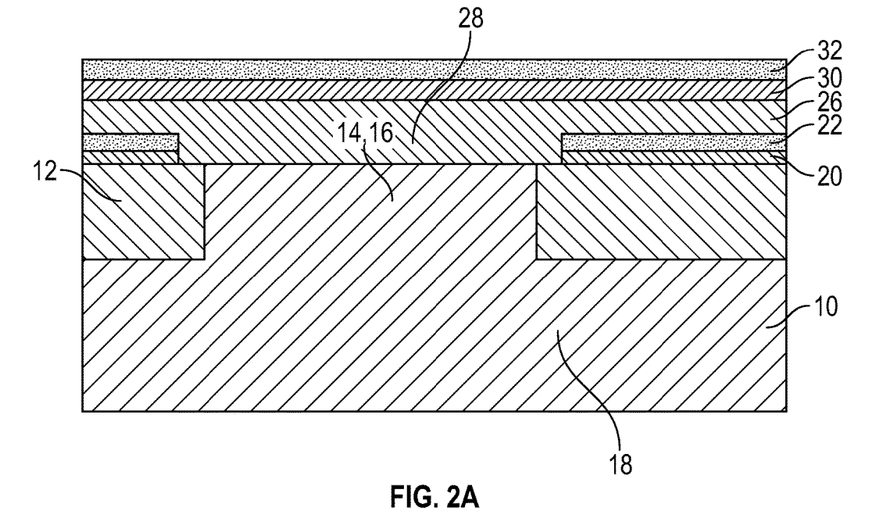
FIGS. 2A, 2B are cross-sectional views similar to FIGS. 1A, 1B at a subsequent fabrication stage of the processing method.
Figure 2B:
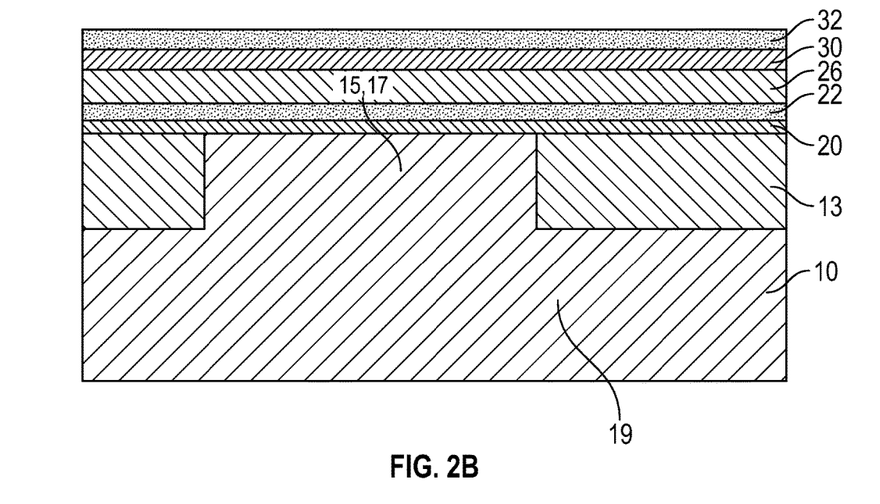

With reference to FIGS. 2A, 2B in which like reference numerals refer to like features in FIGS. 1A, 1B and at a subsequent fabrication stage of the processing method, a base layer 26 of a given thickness is non-selectively deposited across the top surface 10a of substrate 10. The base layer 26 may include a single crystal section 28 positioned in vertical alignment with the device region 14 inside the opening 24 and that directly contacts the single crystal semiconductor material of the device region 14. The single crystal section 28 grows epitaxially on the device region 14 with a crystal structure that has a single orientation. The single crystal section 28 of the base layer 26 defines an intrinsic base that participates in forming an emitter-base junction in the device structure formed using device region 14.

Sections of base layer 26 also form on layer 22 in the field peripheral to the opening 24 and adjoin the single crystal section 28. These sections of base layer 26 may be thinner than the single crystal section 28, and may be comprised of polycrystalline semiconductor material (e.g., polysilicon) with a crystal structure comprised of grains that lack a uniform crystalline orientation resulting from growth on the polycrystalline semiconductor material of layer 22.

The base layer 26 may be comprised of a semiconductor material layer deposited using a non-selective deposition process, such as chemical vapor deposition (CVD). The semiconductor material comprising the base layer 26 may be different than the device region 14 and may have an opposite conductivity type from the collector 16. For example, the base layer 26 may be comprised of a semiconductor material, such as silicon-germanium (SiGe) in an alloy with a content of silicon (Si) ranging from 95 atomic percent to 50 atomic percent and a peak content of germanium (Ge) ranging from 5 atomic percent to 50 atomic percent. The profile of the germanium content across the thickness of the base layer 26 may be graded and/or stepped or, alternatively, may be uniform across the thickness of base layer 26. The semiconductor material of the base layer 26 may further comprise an electrically-active dopant, such as a p-type dopant (e.g., boron) selected from Group III of the Periodic Table in a concentration that is effective to impart p-type conductivity and, optionally, carbon (C) to suppress the diffusion of the p-type dopant.

A sacrificial layer 30 and a sacrificial layer 32 are formed across the top surface 10a of substrate 10 as a layer stack on the top surface of the base layer 26. The sacrificial layer 30 may be comprised of an electrical insulator, such as silicon dioxide ($SiO_2$) grown by thermal oxidation of the base layer 26, that is non-crystalline. The sacrificial layer 32, which is formed on the sacrificial layer 30, may be comprised of a polysilicon semiconductor material, such as polysilicon, deposited by chemical vapor deposition. Deposition of the sacrificial layer 32 on the non-crystalline electrical insulator of sacrificial layer 30 results in the sacrificial layer 32 being polycrystalline.

Figure 3A:
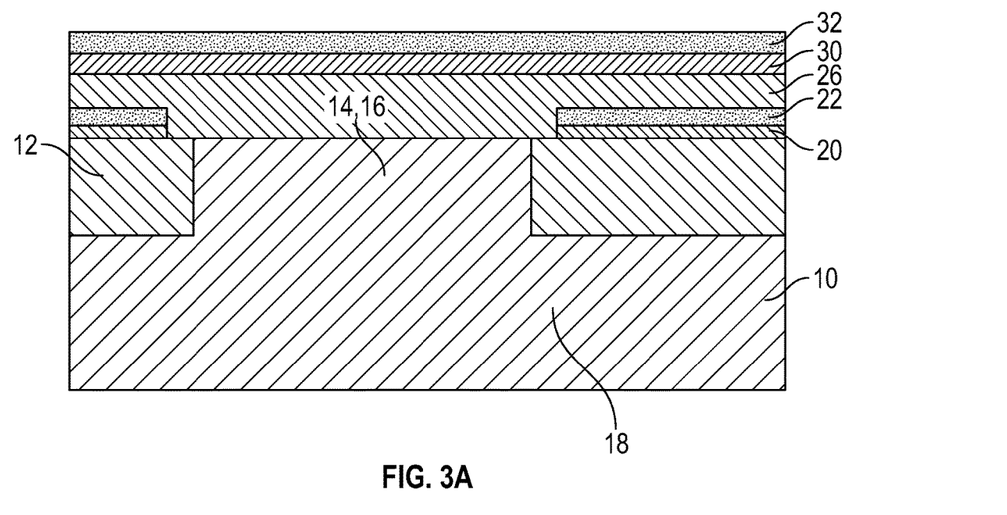
FIGS. 3A, 3B are cross-sectional views similar to FIGS. 2A, 2B at a subsequent fabrication stage of the processing method.
Figure 3B:
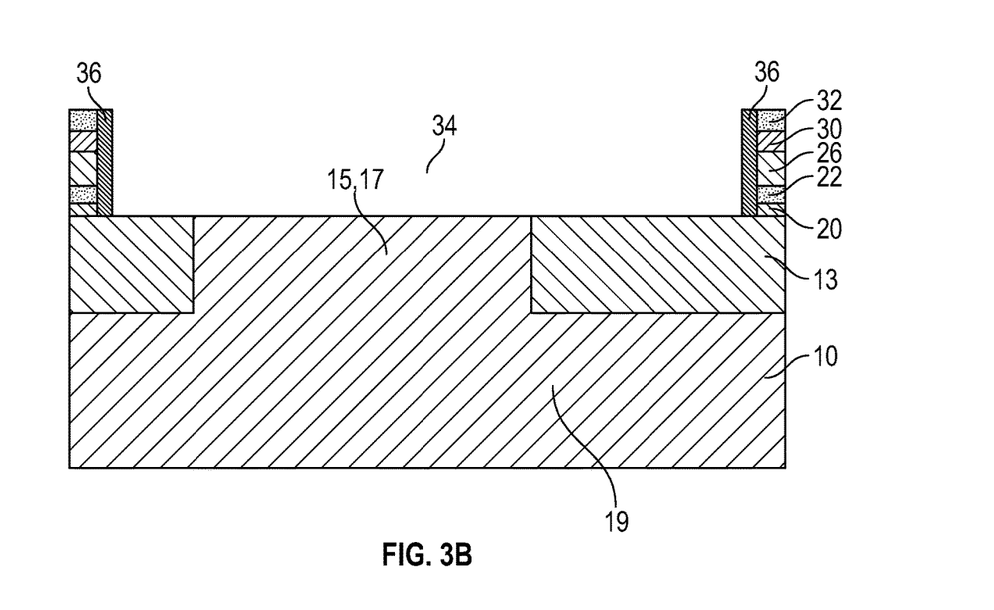

With reference to FIGS. 3A, 3B in which like reference numerals refer to like features in FIGS. 2A, 2B and at a subsequent fabrication stage of the processing method, the layers 20, 22, 26, 30, 32 are opened by patterning to introduce an opening 34 that extends to the device region 15 at the top surface 10a of the substrate 10. The opening 34 may be larger in width than the device region 15 so that the opening 34 slightly overlaps with the trench isolation regions 13 at its periphery. The opening 34 may be formed by applying a non-critical mask to the top surface 10a of the substrate 10. The non-critical mask may comprise, for example, a photoresist that is applied with a spin coating process, pre-baked, exposed to a radiation projected through a photomask, baked after exposure, and developed with a chemical developer to define a pattern with an opening at the intended location of the opening 34. An etching process may be used to remove the unmasked material of the layers 22, 26, 30, 32 to define the opening 34. The etching process may comprise wet chemical etches and/or dry etches of given etch chemistries that remove the materials of the layers 22, 26, 30, 32. The pad layer 20 may then be removed from inside the opening 34 by an etching process, such as by an etching process using dilute hydrofluoric or buffered hydrofluoric. The layers 26, 30, 32 are masked by the mask layer and are preserved over the device region 14 and in its vicinity during patterning.

The mask may be removed subsequent to the formation of the opening 34. If comprised of a photoresist, the mask may be removed by ashing or solvent stripping, followed by a cleaning process.

Spacers 36 are formed on the sidewall extending about the perimeter of the opening 34. The spacers 36 may be formed by depositing a conformal layer comprised of an electrical insulator, such as silicon nitride ($Si_3N_4$) deposited by chemical vapor deposition, and shaping the conformal layer with an anisotropic etching process, such as reactive ion etching, that preferentially removes the electrical insulator from horizontal surfaces.

Figure 4A:
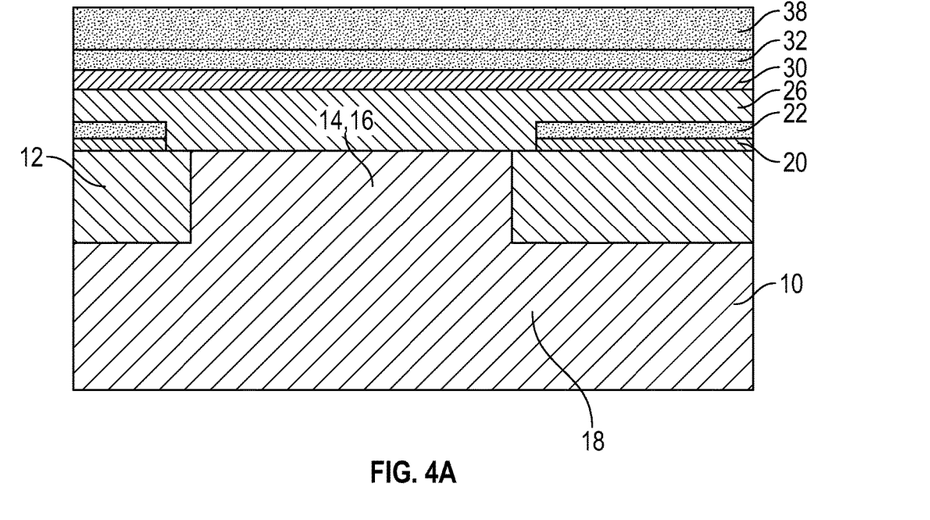
FIGS. 4A, 4B are cross-sectional views similar to FIGS. 3A, 3B at a subsequent fabrication stage of the processing method.
Figure 4B:
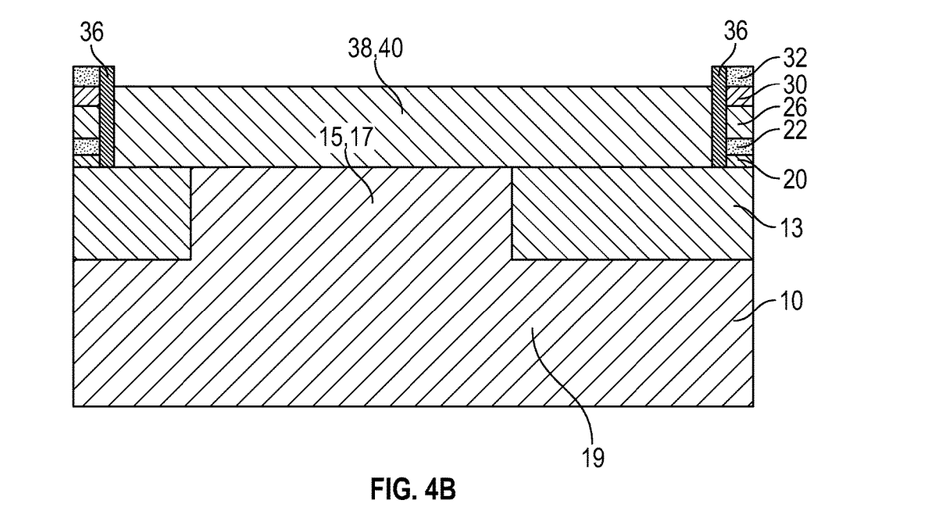

With reference to FIGS. 4A, 4B in which like reference numerals refer to like features in FIGS. 3A, 3B and at a subsequent fabrication stage of the processing method, a base layer 38 of a given thickness is non-selectively deposited across the top surface 10a of substrate 10 after the opening 34 is formed and lined with the spacers 36. The base layer 38 may include a single crystal section 40 positioned in vertical alignment with the device region 14 inside the opening 34 and that directly contacts the single crystal semiconductor material of the device region 14. The single crystal section 40 grows epitaxially on the device region 14 with a crystal structure that has a single orientation. The single crystal section 40 of the base layer 38 defines an intrinsic base that participates in forming an emitter-base junction in the device structure formed using device region 14.

Sections of base layer 38 also form on layer 32 in the field peripheral to the opening 34 and adjoin the single crystal section 40. These sections of base layer 38 may be thinner than the single crystal section 40, and may be comprised of polycrystalline semiconductor material (e.g., polysilicon) with a crystal structure comprised of grains that lack a uniform crystalline orientation resulting from growth on the polycrystalline semiconductor material of layer 32.

The terms "epitaxial growth", "epitaxial deposition", "epitaxially formed", "epitaxially grown", and the like refer to growth of a semiconductor material on a deposition surface comprised of a semiconductor material, in which the semiconductor material being grown has the same crystalline characteristics as the semiconductor material at the deposition surface. In an epitaxial deposition process, the chemical reactants provided by the source gases are controlled and the system parameters for the deposition tool are set so that the depositing atoms arrive at the deposition surface with sufficient energy to be mobile on the deposition surface and self-arrange during growth relative to the crystal lattice structure at the deposition surface. Therefore, an epitaxial semiconductor material has the same crystalline characteristics (e.g., lattice structure) as the deposition surface on which it is grown. In some embodiments, epitaxial growth and/or deposition processes are selective to forming epitaxial grown semiconductor material on semiconductor surfaces, and do not deposit material on dielectric surfaces, such as silicon dioxide or silicon nitride surfaces.

The base layer 38 may be comprised of a semiconductor material layer deposited using a non-selective deposition process, such as chemical vapor deposition (CVD). The semiconductor material comprising the base layer 38 may be different than the device region 15 and may have an opposite conductivity type from the collector 17. For example, the base layer 38 may be comprised of a semiconductor material, such as silicon-germanium (SiGe) in an alloy with a content of silicon (Si) ranging from 95 atomic percent to 50 atomic percent and a peak content of germanium (Ge) ranging from 5 atomic percent to 50 atomic percent. The profile of the germanium content across the thickness of the base layer 38 may be graded and/or stepped or, alternatively, may be uniform across the thickness of base layer 38. The semiconductor material of the base layer 38 may further comprise an electrically-active dopant, such as a p-type dopant (e.g., boron) selected from Group III of the Periodic Table in a concentration that is effective to impart p-type conductivity and, optionally, carbon (C) to suppress the diffusion of the p-type dopant.

The base layers 26, 38 may differ in thickness, composition, and/or concentration of an electrically-active dopant. These are properties determined when the base layers 26, 38 are deposited by the separate depositions in the process flow. In an embodiment, the profile of the germanium content in base layer 38 may differ relative to the profile of the germanium content in base layer 26 such that the composition of the layers 26, 38 differs across their respective thicknesses. For example, base layers 26, 38 of the same thickness may have the same stepped/graded profile of germanium content with base layer 38 having a higher peak concentration of germanium. As another example, base layers 26, 38 of the same thickness may have different stepped/graded profiles of germanium content and the peak concentrations of germanium may differ between the layers 26, 38. In addition, the thickness and/or doping of the base layer 38 may differ from the thickness and/or doping of base layer 26. Differences in the thickness may operate to generate differences in the profiles of germanium content in the layers 26, 38. The differences may reflect different applications for the device structures formed using device regions 14, 15. Device structures fabricated using only a single base layer lack the flexibility enabled by the introduction of multiple base layers 26, 38 into the fabrication process.

Figure 5A:
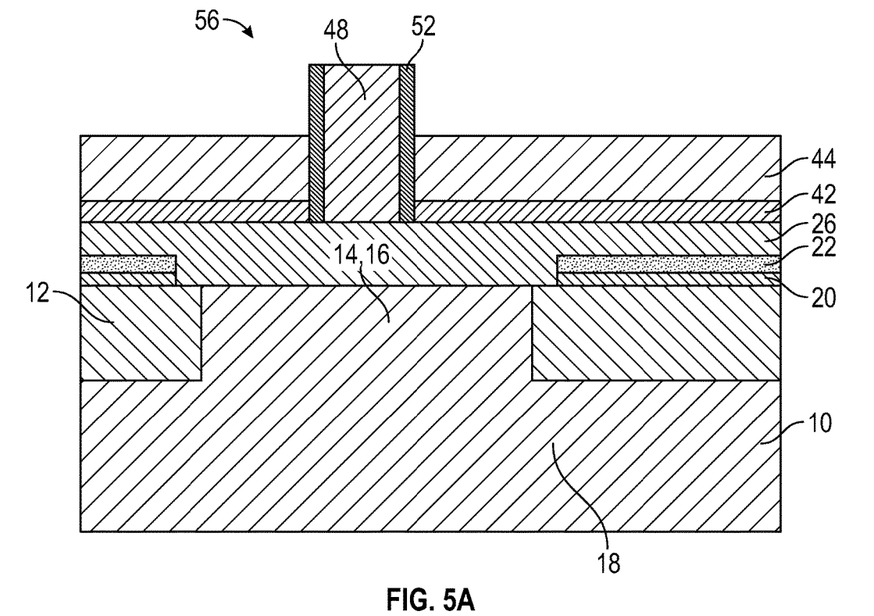
FIGS. 5A, 5B are cross-sectional views similar to FIGS. 4A, 4B at a subsequent fabrication stage of the processing method.
Figure 5B:
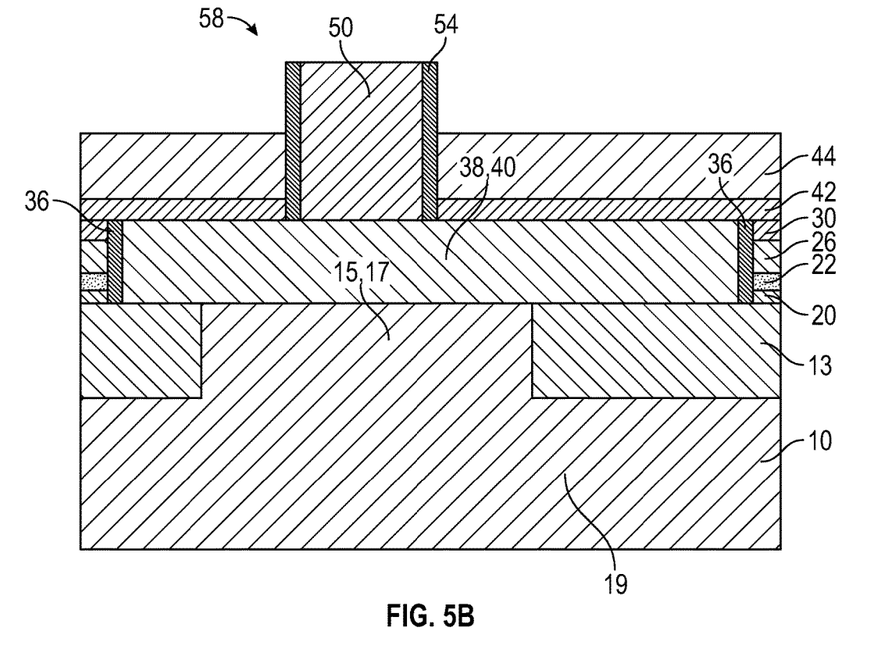

With reference to FIGS. 5A, 5B in which like reference numerals refer to like features in FIGS. 4A, 4B and at a subsequent fabrication stage of the processing method, the layers 30, 32 are removed from device region 14 and its vicinity by applying a non-critical mask and etching. The non-critical mask may comprise, for example, a photoresist that is applied with a spin coating process, pre-baked, exposed to a radiation projected through a photomask, baked after exposure, and developed with a chemical developer to open the surface area including device region 14. An etching process may be used to remove the unmasked material of the layers 30, 32. The etching process may comprise wet chemical etches and/or dry etches of given etch chemistries that remove the materials of the layers 30, 32. The base layer 38 is masked by the non-critical mask and preserved over the device region 14 and in its vicinity. The mask may be removed subsequent to the etching process. If comprised of a photoresist, the mask may be removed by ashing or solvent stripping, followed by a cleaning process.

A dielectric layer 42 is deposited with a given thickness across the top surface 10a of substrate 10. The dielectric layer 42 may be comprised of an electrical insulator with a dielectric constant (e.g., permittivity) characteristic of a dielectric material. In one embodiment, the dielectric layer 42 may be silicon dioxide ($SiO_2$) deposited using chemical vapor deposition.

An extrinsic base layer 44 is deposited with a given thickness across the top surface 10a of the substrate 10 on the base layer 26. The extrinsic base layer 44 may be comprised of polycrystalline semiconductor material, such as polycrystalline silicon, formed by chemical vapor deposition. The semiconductor material of the extrinsic base layer 44 may comprise a dopant, such as a p-type dopant (e.g., boron) selected from Group III of the Periodic Table in a concentration that is effective to impart p-type conductivity and, optionally, carbon (C) to suppress the diffusion of the p-type dopant. One or more dielectric layers may be deposited as a cap on the extrinsic base layer 44.

An emitter 48 is located in an emitter opening that extends through the dielectric layer 42 and the extrinsic base layer 44 to the single crystal section 30 of the base layer 26 on device region 14. Non-conductive spacers 52, which clad the emitter opening and electrically isolate the emitter 48 from the extrinsic base layer 44, are formed before the emitter 48 is formed. An emitter 50 is located in an emitter opening that extends through the dielectric layer 42 and extrinsic base layer 44 to the single crystal section 40 of the base layer 38 on device region 15. Non-conductive spacers 54, which clad the emitter opening and electrically isolate the emitter 50 from the extrinsic base layer 44, are formed before the emitter 50 is formed. The emitter openings may be formed by patterning with photolithography and etching processes.

The emitters 48, 50 may be formed from a layer of heavily-doped semiconductor material that is deposited and then patterned using photolithography and etching processes. For example, the emitters 48, 50 may be comprised of a polycrystalline semiconductor material, such as polysilicon deposited by chemical vapor deposition, and may heavily doped with a concentration of a dopant, such as an n-type dopant (e.g., phosphorus (P) or arsenic (As)) from Group V of the Periodic Table effective to impart n-type conductivity. In an alternative embodiment, the emitters 48, 50 may be formed separately from different layers of heavily-doped semiconductor material instead of concurrently from the same layer of heavily-doped semiconductor material.

A device structure 56 is formed by the processing method in association with device region 14. The device structure 56 features a vertical architecture in which the collector 16, the single crystal section 28 of the base layer 26, and the emitter 48 are vertically arranged with the single crystal section 28 of the base layer 26 located vertically between the emitter 48 and the collector 16. The conductivity type of the semiconductor material constituting the base layer 26 is opposite to the conductivity type of the semiconductor materials constituting the emitter 48 and the collector 16. In an embodiment in which two or all three of the collector 16, the base layer 26, and the emitter 48 are comprised of different semiconductor materials, the device structure 56 may be characterized as a heterojunction bipolar transistor. An emitter-base junction is defined at the interface between the emitter 48 and the single crystal section 28 of the base layer 26. A top surface of the extrinsic base layer 44 is raised relative to the emitter-base junction. A base-collector junction is defined at the interface between the collector 16 and the single crystal section 28 of the base layer 26. The device structure 56 includes an intrinsic device region coinciding with the portions of the collector 16, the base layer 26, and the emitter 48 participating in the junctions and an extrinsic device region outside of the intrinsic device region.

A device structure 58 is formed by the processing method in association with device region 15. The device structure 58 features a vertical architecture in which the collector 17, the single crystal section 40 of the base layer 38, and the emitter 50 are vertically arranged with the single crystal section 40 of the base layer 38 located vertically between the emitter 50 and the collector 17. The conductivity type of the semiconductor material constituting the base layer 38 is opposite to the conductivity type of the semiconductor materials constituting the emitter 50 and the collector 17. In an embodiment in which two or all three of the collector 17, the base layer 38, and the emitter 50 are comprised of different semiconductor materials, the device structure 58 may be characterized as a heterojunction bipolar transistor. An emitter-base junction is defined at the interface between the emitter 50 and the single crystal section 40 of the base layer 38. A top surface of the extrinsic base layer 44 is raised relative to the emitter-base junction. A base-collector junction is defined at the interface between the collector 17 and the single crystal section 40 of the base layer 38. The device structure 58 includes an intrinsic device region coinciding with the portions of the collector 17, the base layer 38, and the emitter 50 participating in the junctions and an extrinsic device region outside of the intrinsic device region.

Standard silicidation and standard middle-of-line (MOL) and back-end-of-line (BEOL) processing follows, which includes formation of contacts and wiring for the local interconnect structure overlying the device structures 56, 58, and formation of dielectric layers, via plugs, and wiring for an interconnect structure coupled by the interconnect wiring with the device structures 56, 58, as well as other similar contacts for additional device structures like bipolar junction transistor and CMOS transistors included in other circuitry fabricated on the substrate 10. Other active and passive circuit elements, such as diodes, resistors, capacitors, varactors, and inductors, may be integrated into the interconnect structure and available for use in the BiCMOS integrated circuit.

The device structures 56, 58, which are on the same substrate 10 and that have different base layers 26, 38, may have germanium concentration profiles that are optimized for different applications of the device structures 56, 58. The ability to optimize the performance of both device structures 56, 58 contrasts with restrictive processes in which only one or the other of the device structures 56, 58 may be optimized because the same base layer and its composition, doping, and thickness are shared and not individually selectable.

In an embodiment, the device structure 56 may comprise a front-end low-noise amplifier (LNA) and the device structure 58 may comprise an output power amplifier (PA) that are coupled with an antenna for high-frequency communications. The device structure 56 is configured to capture an unpredictable low-power, low-voltage signal along with associated random noise presented to it by the antenna and amplify the low-power, low-voltage signal to a useful level. The depth profile of the germanium content for the base layer 26 of device structure 56 can be optimized to provide a high beta and a low base resistance. The device structure 58 is configured to accept a comparatively strong predictable signal from other circuitry on the chip with a high signalto-noise ratio and boost its power. The depth profile of the germanium content for the base layer 38 of device structure 58 can be optimized to provide a low base-to-emitter capacitance (Vbe) and a high BVceo (collector to emitter breakdown voltage with the base open). To provide these different functionalities in device structures 56, 58 with base layers 26, 38 comprised of silicon-germanium, the depth profile of the germanium content in the base layer 26 and its single crystal section 30 may differ from the depth profile of the germanium content in the base layer 38 and its single crystal section 40. For example, the depth profile of the germanium content may differ in that the germanium peak value and position are different. In addition, the concentration profile of the electrically-active dopant (e.g., boron) in the base layer 26 and its single crystal section 30 may differ from the concentration profile of the electrically-active dopant in the base layer 38 and its single crystal section 40. Furthermore, the thickness of the single crystal section 30 of the base layer 26 may differ from the thickness of the single crystal section 40 of the base layer 38.

The device structures 56, 58 may have respective base layers 26, 38 with properties that are optimized for other applications, such as optimizing device structure 56 for high cut-off frequency (fT) operation and optimizing device structure 58 for high maximum oscillation frequency (fmax) devices or optimizing device structure 56 for use as a power amplifier and optimizing device structure 58 for operation as a high performance device. Layout differences and the use of selectively implanted collectors may be used to further tailor the figures of merit for the device structures 56, 58.

Figure 6A:
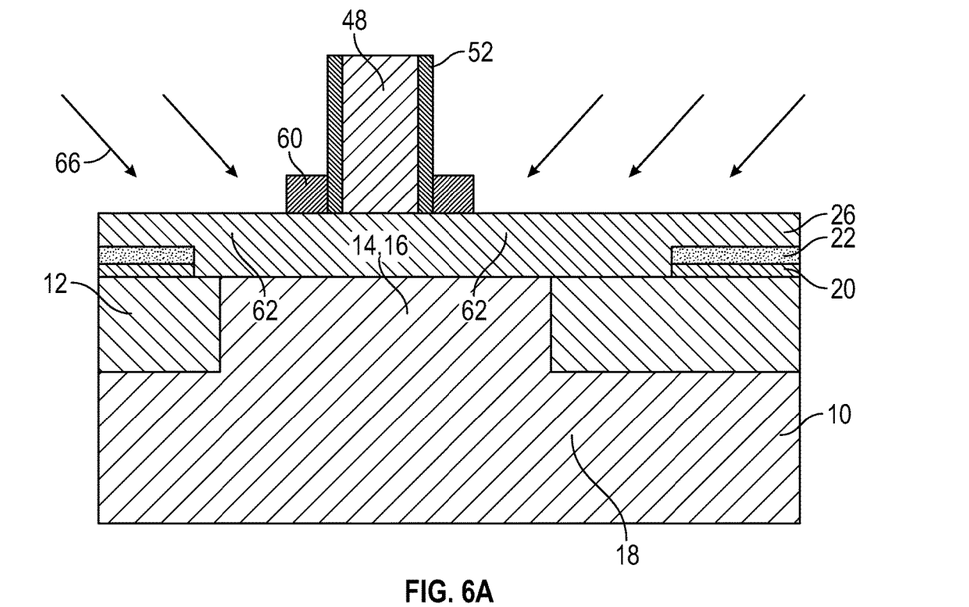
FIGS. 6A, 6B are cross-sectional views similar to FIGS. 5A, 5B of device structures fabricated by a fabrication process in accordance with an alternative embodiment of the invention.
Figure 6B:
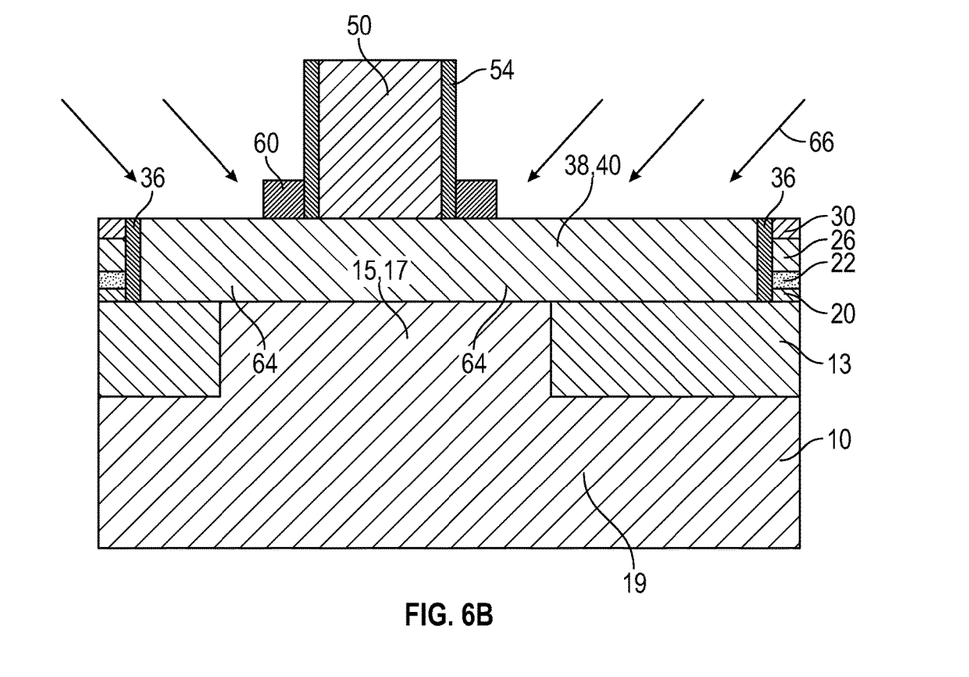

With reference to FIGS. 6A, 6B in which like reference numerals refer to like features in FIGS. 4A, 4B and in accordance with an alternative embodiment of the invention, the layers 30, 32 are removed from device region 14 and its vicinity by applying a non-critical mask and etching as described above. A pad layer 60 is deposited across the top surface 10a of the substrate 10. The pad layer 60 may be comprised of a dielectric material, such as silicon dioxide deposited by chemical vapor deposition. The pad layer 60 is patterned to provide respective landing zones for the emitter openings. The emitters 48, 50 are subsequently formed.

Portions of the base layers 26, 38 adjacent to the respective emitters 48, 50 may receive a concentration of a dopant 66 effective to enhance the electrical conductivity and form respective extrinsic bases 62, 64 of the device structures 56, 58. In an embodiment, the base layers 26, 38 may be implanted with ions of the dopant 66 at a given dose and kinetic energy to provide the dopant concentration. The emitters 48, 50 and spacers 52, 54 may self-align the portions of the base layers 26, 38 that receive a concentration of the dopant 66.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure comprising:
a first base layer on a first device region of a substrate;
a first emitter on the first base layer, the first emitter defining a first junction with the first base layer;
a second base layer on a second device region of the substrate; and
a second emitter on the second base layer, the second emitter defining a second junction with the second base layer,
wherein the first base layer and the second base layer differ in thickness, composition, concentration of an electrically-active dopant, or a combination thereof,
wherein the second device region is defined by a plurality of trench isolation regions in the substrate, the first base layer is formed on the second device region and on the trench isolation regions, and a portion of the second base layer is positioned inside an opening extending through the first base layer to the second device region.

2. The device structure of claim 1 further comprising:
before the second base layer is formed and before the opening is formed, forming a first sacrificial layer on the first base layer,
wherein the opening extends through the first sacrificial layer.

3. The device structure of claim 2 further comprising:
a plurality of spacers at a periphery of the opening.

4. The device structure of claim 3 wherein the first base layer includes a single crystal section on the first device region and a non-single crystal section outside of the first device region, and the second base layer includes a single crystal section on the second device region and a non-single crystal section outside of the second device region.

5. The device structure of claim 1 further comprising:
a second sacrificial layer on the first base layer,
wherein the opening extends through the second sacrificial layer.

6. The device structure of claim 1 wherein the first base layer and the second base layer differ in composition, the first base layer and the second base layer are comprised of silicon-germanium, the first base layer has a first profile of germanium content, and the second base layer has a second profile of germanium content that differs from the first profile of germanium content.

7. The device structure of claim 1 wherein the first base layer has a first thickness and the second base layer has a second thickness that is not equal to the first thickness.

8. The device structure of claim 1 further comprising:
a first extrinsic base in a portion of the first base layer; and
a second extrinsic base in a portion of the second base layer.

9. The device structure of claim 1 further comprising:
an extrinsic base layer on the first base layer and the second base layer,
wherein the first emitter and the second emitter are located in respective emitter openings extending through the extrinsic base layer.

10. The device structure of claim 1 wherein the first base layer has a first thickness, the second base layer has a second thickness that is equal to the first thickness, and the second profile of germanium content has a higher peak concentration of germanium than the first profile of germanium content.

11. The device structure of claim 10 wherein the first base layer has a first thickness, the second base layer has a second thickness that is equal to the first thickness.

12. The device structure of claim 1 wherein a first device structure including the first base layer, the first device layer, and the first emitter comprises a front-end low-noise amplifier, and a second device structure including the second base layer, the second device layer, and the second emitter comprises an output power amplifier.

13. The device structure of claim 12 wherein the first device structure is a first heterojunction bipolar transistor and the second device structure is a second heterojunction bipolar transistor.

14. The device structure of claim 12 wherein the first device structure has a higher beta and a lower base resistance than the second device structure.

15. The device structure of claim 12 wherein the second device structure has a lower base-to-emitter capacitance and a higher collector to emitter breakdown voltage than the first device structure.

\* \* \* \* \*

UNITED STATES PATENT AND TRADEMARK OFFICE
CERTIFICATE OF CORRECTION

| | |
|---|---|
| PATENT NO. | : 9,590,082 B1 |
| APPLICATION NO. | : 14/965267 |
| DATED | : March 7, 2017 |
| INVENTOR(S) | : Vibhor Jain et al. |

Page 1 of 1

It is certified that error appears in the above-identified patent and that said Letters Patent is hereby corrected as shown below:

In the Claims

At Column 10, Claim No. 2, Line numbers 25-26, delete "before the second base layer is formed and before the opening is formed, forming"

Signed and Sealed this
Nineteenth Day of January, 2021

Andrei Iancu
*Director of the United States Patent and Trademark Office*